US006975172B2

(12) United States Patent
Craynon et al.

(10) Patent No.: US 6,975,172 B2
(45) Date of Patent: Dec. 13, 2005

(54) SMART VOLTAGE RAIL REDUCTION AUDIO AMPLIFIER

(75) Inventors: Michael Shawn Craynon, Newton, MS (US); James W. Brown, Sr., Meridian, MS (US); Lee Carlos Santillano, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 22 days.

(21) Appl. No.: 10/837,982

(22) Filed: May 3, 2004

(65) Prior Publication Data

US 2005/0242885 A1    Nov. 3, 2005

(51) Int. Cl.[7] ............................................. H03F 1/52
(52) U.S. Cl. ..................................... 330/297; 330/298
(58) Field of Search ............................... 330/127, 141, 330/207 P, 281, 285, 297, 298

(56) References Cited

U.S. PATENT DOCUMENTS

| | | | |
|---|---|---|---|
| 4,181,895 A | 1/1980 | Yoshida | 330/279 |
| 4,331,930 A | 5/1982 | Shibata et al. | 330/267 |
| 4,355,341 A | 10/1982 | Kaplan | 361/79 |
| 4,398,159 A | 8/1983 | Ball et al. | 330/262 |
| 4,430,625 A | 2/1984 | Yokoyama | 330/297 |
| 4,484,150 A | 11/1984 | Carver | 330/297 |
| 4,649,235 A | 3/1987 | Sijbers | 379/348 |
| 4,831,334 A | 5/1989 | Hudspeth et al. | 330/10 |
| 4,873,493 A * | 10/1989 | Fujiwara | 330/285 |
| 4,916,406 A | 4/1990 | Ichimura et al. | 330/281 |
| 4,916,407 A | 4/1990 | Olver | 330/151 |
| 5,070,308 A | 12/1991 | Padi | 330/268 |
| 5,216,379 A | 6/1993 | Hamley | 330/134 |
| 5,260,996 A | 11/1993 | Dillon et al. | 379/418 |
| 5,543,753 A | 8/1996 | Williamson | 330/297 |
| 5,606,286 A | 2/1997 | Bains | 330/149 |
| 5,831,477 A | 11/1998 | Tsumura | 330/51 |
| 5,872,481 A | 2/1999 | Sevic et al. | 330/51 |
| 5,898,340 A | 4/1999 | Chatterjee et al. | 330/251 |
| 5,909,145 A | 6/1999 | Zimmerman | 330/128 |
| 6,137,361 A | 10/2000 | Chiu | 330/253 |
| 6,147,555 A | 11/2000 | Posner et al. | 330/149 |
| 6,166,605 A | 12/2000 | Carver | 330/297 |
| 6,204,731 B1 | 3/2001 | Jiang et al. | 330/310 |
| 6,300,837 B1 | 10/2001 | Sowlati et al. | 330/296 |
| 6,313,698 B1 | 11/2001 | Zhang et al. | 330/51 |
| 6,373,340 B1 * | 4/2002 | Shashoua | 330/297 |
| 6,404,823 B1 | 6/2002 | Grange et al. | 375/297 |

(Continued)

*Primary Examiner*—Steven J. Mottola
(74) *Attorney, Agent, or Firm*—Thomas, Kayden, Horstemeyer & Risley, LLP

(57) ABSTRACT

An audio amplifier is provided that adjusts the supply voltage rails communicated to a power amplifier circuit according to the circuit's output. The amplifier compares the output voltage from the power amplifier to a predetermined voltage range to determine if the output voltage is or is not within a predetermined range. If so, the audio amplifier reduces the supply voltage rails for the power amplifier circuit to reduced values. When the output voltage from the power amplifier moves outside the predetermined range, the supply voltage rails return to maximum levels. Whenever the output voltage from the power amplifier is not within the predetermined range, the audio amplifier maintains the supply voltage rails at maximum levels. By reducing the supply voltage rails for the power amplifier circuit, less power is dissipated by the power amplifier circuit, thereby generating less heat in the audio amplifier.

27 Claims, 4 Drawing Sheets

U.S. PATENT DOCUMENTS

| | | |
|---|---|---|
| 6,486,738 B2 | 11/2002 | Park .......................... 330/285 |
| 6,614,303 B2 | 9/2003 | Nentwig ..................... 330/254 |
| 2001/0054931 A1 | 12/2001 | Bar-David ................... 330/10 |
| 2002/0067209 A1 | 6/2002 | Luo et al. ................... 330/296 |
| 2002/0075076 A1 | 6/2002 | Sowlati ....................... 330/296 |
| 2002/0121935 A1 | 9/2002 | Ko ............................. 330/296 |
| 2002/0132652 A1 | 9/2002 | Steel et al. .................. 455/574 |
| 2002/0180521 A1 | 12/2002 | Taylor ........................ 330/129 |
| 2003/0006845 A1 | 1/2003 | Lopez et al. ................ 330/289 |
| 2003/0076172 A1 | 4/2003 | Tichauer ..................... 330/285 |
| 2003/0095000 A1 | 5/2003 | Ramage et al. ............... 330/10 |
| 2003/0146790 A1 | 8/2003 | Arell et al. .................. 330/296 |

* cited by examiner

SMART VOLTAGE RAIL REDUCTION AUDIO AMPLIFIER

FIELD OF THE INVENTION

The present invention relates to an audio amplifier, and more particularly to an amplifier that adjusts the dissipated power in the amplifier's electronics at certain output power levels.

BACKGROUND OF THE INVENTION

Today's amplifiers are called upon to cover a broader dynamic range than previous amplifier generations. For this reason, amplifier circuits are designed to have their supply voltage large enough to handle a maximum input signal without clipping by setting the operating point of an amplification device at an optimum fixed value for such a supply voltage.

However, since the operating point and the supply voltage of such amplifier circuits are primarily set to handle such a large input signal level with minimum distortion, a large amount of operating current, which would not be needed otherwise, will flow even with a small input signal level. In addition, the period during which a maximum input signal is driven into the amplifier circuit is relatively short, thus a large amount of idle current may pass through the amplification device, and this results in unfavorable power consumption, poor amplifier efficiency and durability. Additionally, this situation can create an excessive amount of heat due that can damage the amplification device.

One solution to this problem is to include heat dissipation technologies, such as a heat sink, in the amplifier. Heat sinks may remove the excessive heat resulting from the increased power on the amplification circuitry, which results from the large current and supply voltage. However, heat sinks add weight and cost to the amplifier and are thereby less than desirable solutions for this problem. Plus, even with the implementation of heat sinks in the amplification device, the excessive power dissipated by the amplification circuitry can still result in amplifier damage.

Other solutions include constantly monitoring the amplifier output and then adjusting the supply voltage accordingly so as to keep the power dissipated in the amplifier circuitry within tolerable levels. To accomplish this constant monitoring, additional expensive and complex circuitry is required in the amplifier, which introduces more components that may fail. These additional components oftentimes introduce additional delay, as it is difficult for this type of amplifier to yield a fast transient response.

Thus, a heretofore unaddressed need exists in the industry to address the aforementioned deficiencies and inadequacies.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

The drawings referenced herein are showings for the purposes of illustrating embodiments of the invention and not for purposes of limiting the same. In fact, this description of each preferred and alternative embodiment comprises but select embodiments among others, which one of ordinary skill in the art would know upon review of this disclosure.

Figure 1:
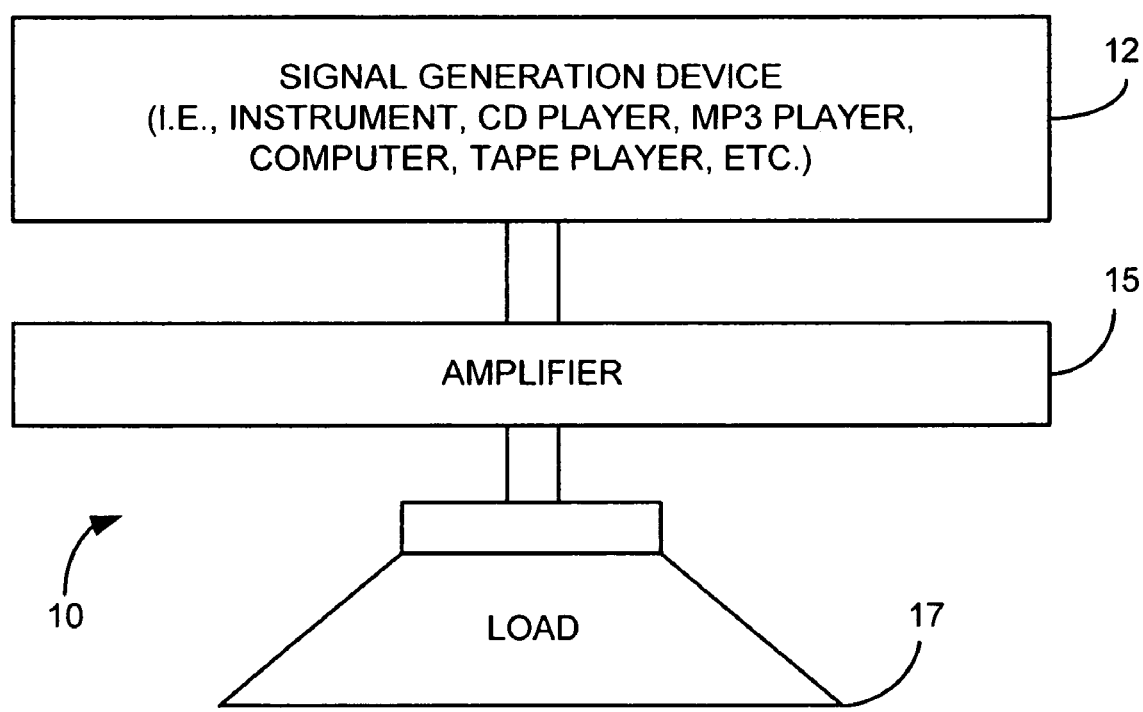
FIG. 1 is a diagram of an audio amplifier coupled to a signal generation source and a load.

FIG. 1 is a diagram of an audio system 10 comprising a signal generation source 12, an audio amplifier 15 and a load 17. The signal generation source may be any electronic device capable of electrically communicating a signal receivable by the amplifier. As nonlimiting examples, signal generation device 12 may be a musical instrument (such as an electric guitar, keyboard, violin, etc.), a CD/DVD player, an MP3 player, a computer or other device capable of playing electronic music files, a magnetic tape player, etc. One of ordinary skill in the art would know that several types of audio signal generations devices could operate as signal generation device 12.

Load 17 comprises one or more loudspeakers. The load relates to the impedance of the loudspeaker, which may be 2, 4, 8, or 16 ohms, as nonlimiting examples.

Amplifier 15 receives an input signal from signal generation device 12. The input signal is amplified, and the amplified signal is output to load 17, which is reproduced as sound waves by the loudspeaker.

As discussed above, amplifiers sometimes have difficulty handling input signals at certain levels because the supply voltage and current level associated with the input signal generates too much power for the components of the amplifier 15 to safely handle. In this situation, the power generates heat in the amplifier that oftentimes damages the electronic components (such as power amp 42 of FIG. 3) in the amplifier 15 causing complete or partial failure of the amplifier 15.

However, one embodiment disclosed herein among others relates to an amplifier 15, which as a nonlimiting example may be a Class A/B amplifier, that is configured to reduce the power dissipated in the amplifier's power amplifier circuitry when its output tracks into a predetermined value range and remains within that range for an predetermined length of time. By reducing the supply voltage rails when the output voltage is within the predetermined range, the amplifier generates less heat and operates more efficiently.

Figure 2:
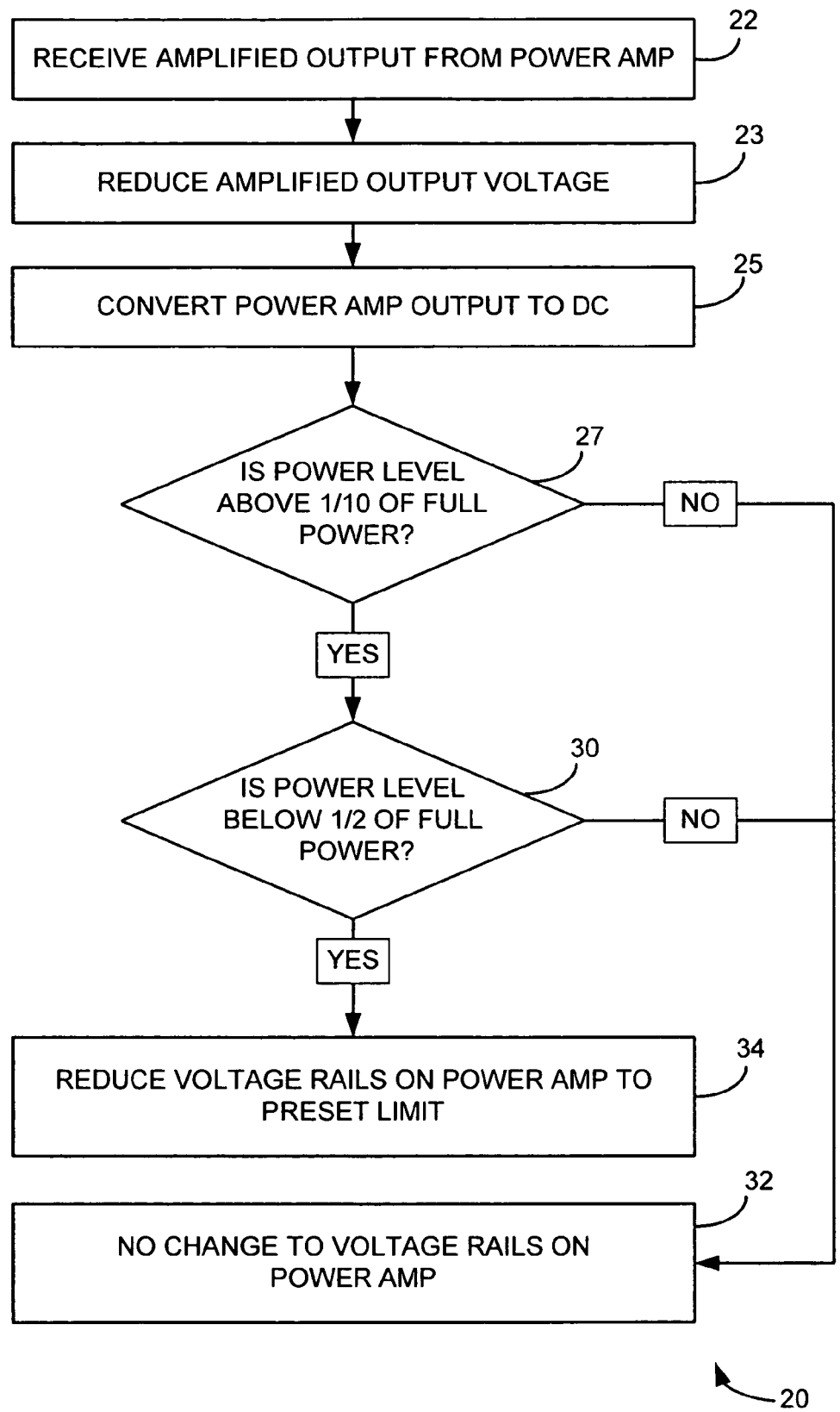
FIG. 2 is a diagram of the method for reducing the voltage rails on the power amplifier in the amplifier of FIG. 1 based on preset conditions.

FIG. 2 is a diagram of the method 20 for reducing the supply voltage rails on the power amplifier circuit in the amplifier 15 of FIG. 1 based on preset conditions. This method 20 may be logically configured in amplifier 15 according to preprogrammed settings. As an alternative embodiment, one or more of the settings may be user adjustable.

As stated above, signal generation device 12 electrically communicates a signal, which in one nonlimiting embodiment is an analog signal, to amplifier 15. One or ordinary skill would know, however, that the signal input to amplifier 15 could be a digital signal that is internally converted to an analog signal by the amplifier 15. The input signal is amplified by the amplifier 15 and communicated to the loudspeaker load 17. However, the output from the power amplifier circuit (power amp 42 of FIG. 3) in amplifier 15 is also, as shown in step 22, communicated to a circuit that sets the supply voltage rails for the power amplifier circuit. As shown in step 23, the voltage of the amplifier output is reduced for further signal processing. The output from the power amplifier circuitry in amplifier 15 is converted to a DC voltage for further processing, as shown in step 25.

After DC voltage conversion, the voltage level is measured to determine if it is within a predetermined range. In one embodiment among others, the predetermined voltage range is in the area between 1/10 and 1/2 of full power for amplifier 15, which is the range where a typical Class A/B amplifier's output devices dissipate the most power. However, one of ordinary skill in the art would know that other ranges may be configured as the predetermined value range, such as between 1/8 to 1/3 of full output power.

According to this embodiment and nonlimiting example, a determination is made in step 27 whether the DC voltage is above or below a level that corresponds to 1/10 of full output power based on the known impedance of load 17. When the amplifier is operating below approximately 1/10 of full operating power, the voltage across the load 17 is relatively low, which means that the voltage across the power amplifier circuit (i.e., transistors) is high. The voltage across the power amplifier circuit is the difference between the supply voltage and the voltage drop at the load 17. In this instance of approximately 1/10 full power or less, the signal current is low, which means that the power dissipated by the amplifier circuitry of amplifier 15 is also low.

Low power dissipation in the power amp 42 (FIG. 3) of amplifier 15 means that the generated heat is within tolerable limits. Therefore, if the power amp 42 output voltage is not above 1/10 of full power (in this nonlimiting example), the amplifier 15 makes no changes to the supply voltage to the amplifier circuitry, as shown in step 32.

As a nonlimiting example, for a 150-watt amplifier driving an 8-ohm load, the voltage across the load at 1/15 full power, or 10 watts, is approximately 8.9 volts. So if the supply voltage is 40 volts, that means that the voltage drop across the amplifier circuit is approximately 31 volts. In this nonlimiting example, one of ordinary skill would know that the signal current equates to be approximately 1.1 amps. If the supply voltage is 40 volts, power amp 42 (FIG. 3) must dissipate approximately 34.1 watts of power [(40 volts−8.9 volts)*1.1 amps)].

As shown in step 30, the amplifier 15 also determines according to method 20 whether the amplifier's output power level is above 1/2 of full power (in this nonlimiting embodiment). At a higher power level, the voltage across the load is substantially greater, which means that the voltage across the power amp 42 (FIG. 3) is substantially lower. So even though the signal current is greater in driving the load, the power dissipated at the power amp 42 (FIG. 3) is still low.

In continuing the 150-watt amplifier nonlimiting example from above, the 8-ohm load has almost a 35-volt voltage drop across the load at full power. For the 40-volt supply, that means that the power amp 42 (FIG. 3) only has about a 5 volt drop. While the signal current is approximately 4.3 amps, (square root of the power times the load resistance), the power dissipated at the power amp 42 (FIG. 3) is approximately 21.65 watts. So at full power (150 watts in this nonlimiting example), amplifier 15 dissipates less power at power amp 42 (FIG. 3) than it does at less than 1/15 of full power.

Consequently, if the power amp 42 (FIG. 3) is operating above 1/2 full power, the voltage of the signal measured at step 30 results in advancement to step 32 whereby the supply voltage to amplifier circuitry in amplifier 15 is unchanged.

Figure 3:
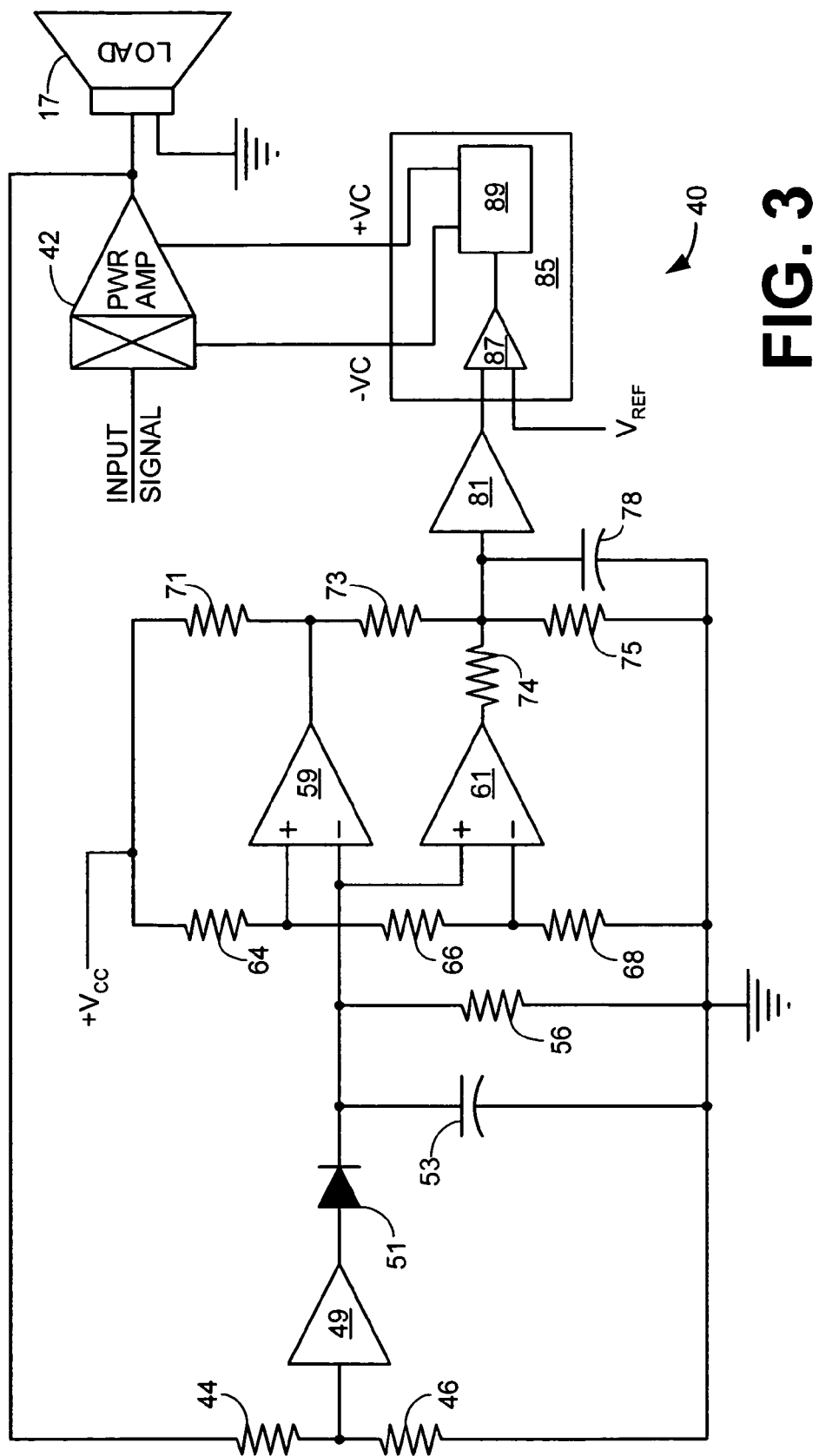
FIG. 3 is a diagram of one embodiment among others for configuring a circuit for implementing the smart voltage rail reduction method in the amplifier of FIG. 1 according to the method depicted in FIG. 2.

If the measurement of the signal voltage described at step 30 corresponds to an amplifier power level that is less than 1/2 power but greater than 1/10 power (resulting from a YES result in step 27), the process advances to step 34 to reduce the supply voltage rails to the power amp 42 (FIG. 3). This reduction occurs because power amp 42 (FIG. 3) dissipates the most power in this range.

Returning to the nonlimiting example from above, if the amplifier 15 is operating at 1/3 of full power, or at 50 watts, in this example, the voltage drop across the load is 20 volts. The signal current at 50 watts is 2.5 amps. If the supply voltage is 40 volts, and there is a 20-volt voltage drop across power amp 42 (FIG. 3), then that also means that power amp 42 (FIG. 3) must dissipate 50 watts of power. So for this reason, the method 20 advances from step 30 to step 34 to reduce the supply voltage, which effectively reduces the voltage drop across power amp 42 (FIG. 3), thereby reducing the power dissipation in the amplifier as well.

It is well known that amplifiers generate the greatest amount of heat in the range of approximately 1/8 to 1/3 operating power for the reasons discussed above. As also stated above, heat sinks may be used and are typically configured to dissipate heat at 1/3 operating power. But, the method described above operates to reduce the supply voltage rails when the amplifier power output tracks within a predetermined range, such as the nonlimiting exemplary range of 1/10 to 1/2 of full power.

But rather than constantly tracking the output voltage and adjusting the supply voltage rails on a continual basis, adjustment is made when the output voltage tracks within the predetermined range and not when the signal is outside that range. This scheme provides for a faster transient response for the amplifier.

While the signal corresponding to the amplifier output is above or below the predetermined range, which in this nonlimiting example is 1/10 to 1/2, the supply voltage rails on power amp 42 (FIG. 3) remain at normal high levels (40 watts in the nonlimiting example above). However, when the signal tracks into the predetermined range for a predetermined time, the supply voltage rails are reduced to a level that decreases the power dissipated by the power amp 42 (FIG. 3).

This reduction does not affect the power delivered to the load. More specifically, the load on the loudspeaker remains constant (i.e., 4 ohms, 8 ohms, etc.). The voltage drop across the loudspeaker load remains the same as well. By reducing the supply voltage, the reduction is seen at the voltage drop across power amp 42 in FIG. 3. Stated another way, by providing a lower voltage that is still greater than the voltage drop across the load, the remaining voltage to drop across power amp 42 (FIG. 3) is lower. This reduction means that the dissipated power at power amp 42 (FIG. 3) will also be lower irrespective of the signal current.

The amount of time after the signal enters the predetermined range is a function of the amplifier's ability to dissipate heat. By reducing the output voltage of the power amplifier circuit, the amount of generated heat decreases and the output sound is not distorted. When the signal tracks back out of the predetermined range, whether on the low or high end, the output voltage rails return to normal values.

FIG. 3 is a diagram of one embodiment among others for configuring a circuit 40 for implementing the smart voltage rail reduction method 20 in the amplifier 15 of FIG. 1, as depicted in FIG. 2. The input signal is received from the signal generation device 12. The signal is amplified by, in this nonlimiting example, linear power amplifier 42, which drives load 17.

The output from power amp 42 is divided by resistors 44 and 46 and communicated to buffer 49. The voltage is divided so that smaller-sized components may be implemented in this embodiment, so one of ordinary skill in the art would know that the larger electronic components could be used in lieu of the voltage dividing resistors shown in FIG. 3. (The configuration of FIG. 3 is but one embodiment among others.)

The output from power amp 42 is an AC voltage. So rectifying diode 51 operates to convert the AC voltage to a DC voltage, which is filtered by capacitor 53 and resistor 56.

The DC signal is communicated to a window comparator composed of comparators 59 and 61. Comparator 59 determines if the DC voltage signal is less than a preset voltage value, and comparator 61 determines if the DC voltage signal is above a preset voltage value. In the nonlimiting example above, the preset voltage range boundaries are $\frac{1}{10}$ to $\frac{1}{2}$ of full amplifier output power.

Resistors 64, 66, and 68 set the reference value levels for comparators 59 and 61 so that if the voltage of the DC voltage signal is within a predetermined range, comparators 59 and 61 switch their output to high. Resistors 71 and 73 are pull-up resistors that operate to charge capacitor 78. As long as the output from comparators 59 and 61 is high, which corresponds to the DC voltage relating to a $\frac{1}{10}$ to $\frac{1}{2}$ power amp output level, capacitor 78 continues to charge positively.

As capacitor 78 is charged, the signal is communicated through impedance buffer 81 to integrated circuit 85. In this nonlimiting example, integrated circuit 85 is a pulse width modulating controller that operates to reduce the supply voltage to the power amp 42 when it receives a signal that is higher than the reference voltage $V_{REF}$ of error amplifier 87. If the signal communicated to integrated circuit 85 is lower than the reference voltage $V_{REF}$ of error amplifier 87, such as when the power amp 42 is operating below $\frac{1}{10}$ of full power or above $\frac{1}{2}$ of full power (in this nonlimiting example), the integrated circuit 85 allows the supply voltage rails to remain at the maximum level.

Integrated circuit 85 does not operate to immediately reduce the supply voltage to the power amp 42 whenever the output power from power amp 42 is between $\frac{1}{10}$ and $\frac{1}{2}$ power (or according to another predetermined range). Instead, integrated circuit 85 is configured to reduce the supply voltage to power amp 42 when capacitor 78 becomes completely charged. There is a delay from when the comparators 59 and 61 output a high signal to when capacitor 78 is fully charged. This delay prevents the constant decrease and increase in the supply voltage to power amp 42, which would otherwise decrease the efficiency and sound quality of amplifier 15 if the supply voltage were constantly adjusting. The input signal from the signal generation source 12 (FIG. 1) may constantly cause the amplifier output to repeatedly track in and out of the predetermined voltage range. So capacitor 78 takes an amount of time to charge, but once charged, it holds a high signal level to integrated circuit 85 until the output from power amp 42 tracks out of the $\frac{1}{10}$ to $\frac{1}{2}$ range. Yet, the repeated tracking in and out of the predetermined voltage range for short intervals does not permit the capacitor 78 to charge and thereby reduce the voltage rails supplied to power amp 42.

When the output power from power amp 42 tracks outside of the predetermined range, which in this nonlimiting example is between $\frac{1}{10}$ to $\frac{1}{2}$ of full power, comparators 59 and 61 output a low signal value. Resistors 73 and 74 operate to quickly discharge capacitor 78. In the discharging of capacitor 78, a low signal value is communicated to integrated circuit 85, which results in integrated circuit returning the supply voltage rails to maximum configured levels.

As discussed above, integrated circuit 85 is a pulse width modulating circuit. But one of ordinary skill in the art would know that other circuit combinations may be implemented to likewise achieve the result of adjusting the supply voltage to the power amp 42.

Additionally, the value of resistors 71, 73, and 75 determine the value of the supply voltage rails, as the value of these resistors configure the voltage of the signal output by comparators 59, 61 and maintained by capacitor 78. One of ordinary skill would know that numerous resistor value combinations would operate to produce any number of desirable supply voltage rail value ranges.

Figure 4:
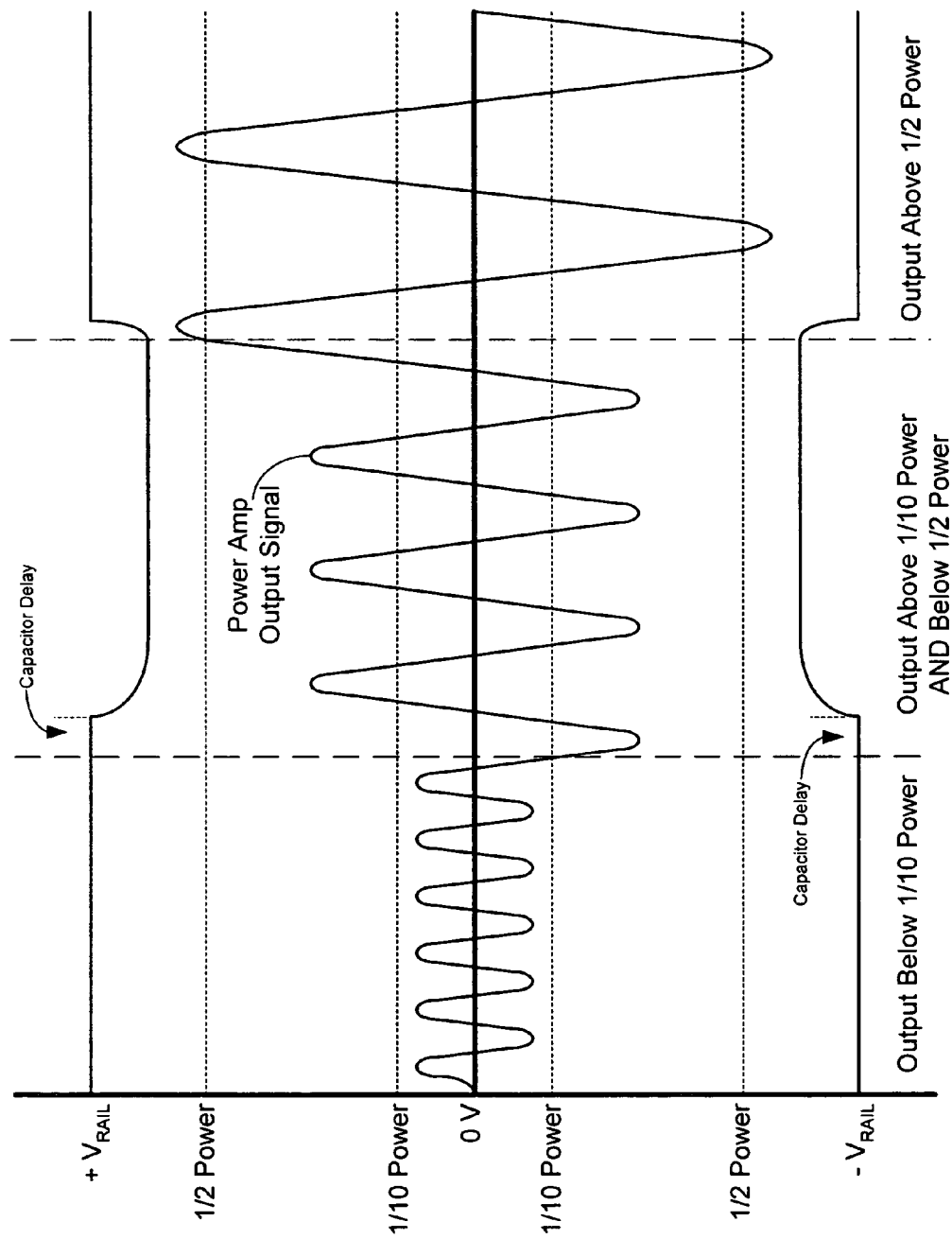
FIG. 4 is a diagram of the graphical representation of the output power of the amplifier shown in FIGS. 1 and 3 with the supply voltage rails reduced.

FIG. 4 is a graphical representation of the output power from power amp 42 of FIG. 3 and the supply voltage rails. In the first part of the chart where the output power is below $\frac{1}{10}$, the voltage rails are depicted at their maximum outer limits because the corresponding voltage is below the threshold set according to circuit 40 (FIG. 3). In this situation, the power dissipated by power amp 42 is within tolerable limits.

However, in the middle section of chart 86, the power amp output is shown to be between $\frac{1}{10}$ and $\frac{1}{2}$ of full power. As discussed above, the circuit 40 recognizes this event and operates to reduce the voltage rails, as shown in chart 86. It should be noted that the $+V_{RAIL}$ and $-V_{RAIL}$ rail reduction is shown in chart 86 as delayed due to capacitor 78.

Finally, the third section of chart 86 depicts the power amp output signal increasing beyond $\frac{1}{2}$ power. It should be noted in this instance that the voltage rails return to their outer limits more quickly than as they were reduced.

The configuration described above and shown in FIG. 3 is generally tailored for a predetermined impedance load 17. However, amplifier 15 may be configured for multiple impedances. In this alternative embodiment the amplifier 15 may be configured with multiple outputs couplable to a load 17 wherein each output relates to a predetermined impedance load. As a nonlimiting example, one output jack may be for a 4-ohm load, another for an 8-ohm load, and another for a 16-ohm load. By physically coupling the different impedance load loudspeakers 17 to the different jack outputs, different resistor values are implemented for each of resistors 64, 66, and 68.

Alternatively, amplifier 15 may also include an impedance selector switch that changes the values or resistors 64, 66, and 68 in relation to the dialed in impedance of load 17. By adjusting the impedance selector switch, different resistors may become electrically coupled at the positions of resistors 64, 66, and 68 respectively with the correct resistance levels for the corresponding impedance level.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

We claim:

1. A method for adjusting the supply voltage in an audio amplifier, comprising the steps of:
   converting the output from a power amplifier circuit in the audio amplifier to a DC signal;
   comparing the voltage of the DC signal to a predetermined voltage range to determine whether the DC signal voltage is within the predetermined voltage range;
   charging a capacitor to a predetermined charge value if the DC signal voltage is within the predetermined voltage range; and
   reducing a positive and negative supply voltage rail provided to the power amplifier circuit if the predetermined charge value is sufficiently high.

2. The method of claim 1, further comprising the step of:
   setting the supply voltage rails at the outer limits when the DC signal voltage is not within the predetermined voltage range.

3. The method of claim 1, further comprising the steps of:
   comparing the predetermined charge value to a reference voltage; and
   communicating a control signal to a modulator circuit to reduce the positive supply voltage rail and raise the negative supply voltage rail based on the output of the comparison of the predetermined charge value and the reference voltage.

4. The method of claim 1, further comprising the step of:
   discharging the capacitor if the DC signal is not within the predetermined voltage range so that the positive supply voltage rail is not reduced and the negative supply voltage rail is not raised.

5. The method of claim 1, further comprising the step of:
   dividing the voltage level of the output from a power amplifier circuit in the audio amplifier to a lower voltage signal.

6. The method of claim 1, further comprising the step of:
   filtering the DC signal prior to comparing the DC signal to the predetermined voltage range.

7. The method of claim 1, wherein the predetermined voltage range is between $1/10$ and $1/2$ of full power of the power amplifier circuit.

8. The method of claim 1, wherein the predetermined voltage range is between $1/8$ and $1/3$ of full power of the power amplifier circuit.

9. A method for adjusting the supply voltage to a power amplifier, comprising the steps of:
   comparing the output voltage from the power amplifier to a predetermined voltage range to determine if the output voltage value is or is not within a predetermined voltage range;
   setting the supply voltage rails for the power amplifier to maximum values if the output voltage from the power amplifier is less than the predetermined voltage range;
   setting the supply voltage rails for the power amplifier to maximum values if the output voltage from the power amplifier is greater than the predetermined voltage range; and
   setting the supply voltage rails for the power amplifier to values that are less than the maximum values if the output voltage from the power amplifier is within the predetermined voltage range.

10. The method of claim 9, further comprising the step of:
    delaying the resetting of the supply voltage rails for the power amplifier to values that are less than the maximum values by a configurable time when the output voltage from the power amplifier is within the predetermined voltage range.

11. The method of claim 10, wherein the delayed resetting of the supply voltage rails for the power amplifier to values that are less than the maximum values may be adjusted.

12. The method of claim 9, further comprising the step of:
    converting the output voltage from the power amplifier from an AC voltage to a DC voltage.

13. The method of claim 9, wherein the predetermined voltage range is between $1/10$ and $1/2$ of full power of the power amplifier.

14. The method of claim 9, wherein the predetermined voltage range is between $1/8$ and $1/3$ of full power of the power amplifier.

15. An audio amplifier with a power amplifier circuit, comprising:
    a comparator circuit coupled to the output of the power amplifier circuit configured to generate a logic high signal if the voltage level of the output of the power amplifier is within a preset range;
    a capacitor circuit coupled to the comparator circuit and configured to maintain a charge if the comparator generates a logic high signal; and
    a controller responsive to the charge maintained by the capacitor circuit so as to reduce the supply voltage provided to the power amplifier circuit.

16. The amplifier of claim 15, wherein the power amplifier circuit dissipates less heat when a reduced supply voltage is provided as compared to when a nonreduced supply voltage is provided.

17. The amplifier of claim 15, wherein the supply voltage is reduced only when the voltage level of the output of the power amplifier is within the preset range.

18. The amplifier of claim 15, wherein the preset range is a voltage corresponding to $1/10$ to $1/2$ of full output power for the power amplifier.

19. The amplifier of claim 15, wherein the preset range is a voltage corresponding to $1/8$ to $1/3$ of full output power for the power amplifier.

20. The amplifier of claim 15, further comprising:
    a selector switch for electrically coupling multiple combinations of resistors to the comparator circuit in relation to a plurality of impedance loads coupled to the power amplifier.

21. The amplifier of claim 15, further comprising:
    a plurality of outputs couplable between the power amplifier and a loudspeaker, wherein each of the plurality of outputs corresponds to a separate impedance level of the loudspeaker and wherein each output is electrically coupled to the comparator by separate resistors that adjust the preset range according to each impedance level.

22. The amplifier of claim 15, further comprising:
    a converter coupled between the output of the power amplifier and the comparator configured to convert the power amplifier voltage from AC to DC.

23. The amplifier of claim 15, further comprising:
    a circuit coupled between the capacitor and the controller configured to supply a reference voltage to the controller dependant upon whether the voltage level of the output of the power amplifier is within a preset range.

24. An audio amplifier, comprising:
    an input for receipt of a signal from a source;
    a power amplifier circuit that increases the magnitude of the input signal for communication to an output of the audio amplifier in relation to supply voltage rails electrically communicated to the power amplifier circuit;

a voltage divider coupled to the output of the power amplifier circuit;

a rectifier coupled to the voltage divider to transform the output from the voltage divider from AC to DC;

a window comparator circuit configured to output a logic high signal if the output from the rectifier has a voltage value that is within a predetermined voltage range, the window comparator further configured to output a logic low signal if the output from the rectifier has a voltage value that is not within the predetermined voltage range;

a capacitor coupled to the output of the window comparator that is charged if the window comparator outputs the logic high signal, wherein the capacitor maintains the charge while the window comparator outputs the logic high signal;

a discharge resistor coupled to the capacitor to discharge the capacitor from a charged state when the window comparator output changes from a logic high signal to a logic low signal; and a controller coupled to the capacitor configured to reduce the supply voltage rails to a decreased level when the capacitor is charged to a predetermined voltage level.

25. The amplifier of claim 24, further comprising:

a reference voltage comparator coupled to the controller that provides a comparison voltage which determines the amount of reduction in the supply voltage rails.

26. The amplifier of claim 25, wherein the controller reduces the supply voltage rails upon electrical receipt of the comparison voltage that is higher than a reference voltage.

27. The amplifier of claim 24, wherein the amount of power dissipated in the power amplifier circuit is reduced when the controller reduces the supply voltage rails.

* * * * *